United States Patent
Dietz

(10) Patent No.: US 6,407,548 B1
(45) Date of Patent: Jun. 18, 2002

(54) METHOD FOR THE OPERATION OF A MAGNETIC RESONANCE TOMOGRAPHY APPARATUS, MAGNETIC RESONANCE TOMOGRAPHY APPARATUS FOR THE IMPLEMENTATION OF THE METHOD AND METHOD FOR DESIGNING A MAGNETIC RESONANCE TOMOGRAPHY APPARATUS

(75) Inventor: Peter Dietz, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/493,282

(22) Filed: Jan. 28, 2000

(30) Foreign Application Priority Data

Jan. 29, 1999 (DE) .......................................... 199 03 627

(51) Int. Cl.$^7$ ................................................ G01V 3/00
(52) U.S. Cl. ........................ 324/307; 324/309; 324/314
(58) Field of Search ................................. 324/309, 307, 324/314, 300; 600/410, 412

(56) References Cited

U.S. PATENT DOCUMENTS 6,011,392 A * 1/2000 Zhou ........................... 324/309

OTHER PUBLICATIONS

"Characterization and Prediction of Gradient Acoustic Noise in MR Imagers," Hedeen et al., Magnetic Resonance in Medicine 37 (1997) pp. 7–10.

* cited by examiner

Primary Examiner—Edward Lefkowitz
Assistant Examiner—Brij B. Shrivastav
(74) Attorney, Agent, or Firm—Schiff Hardin & Waite

(57) ABSTRACT

In a method for operating a magnetic resonance tomography apparatus that contains a basic field magnet, a gradient system with gradient coils and a control system that controls the currents in the gradient coils, among other things, on the basis of pulse sequences, noise that is caused by a pulse sequence upon implementation thereof is identified before a start of the pulse sequence. When an identified noise lies above a selectable value, the pulse sequence is modified, so that the modified pulse sequence does not exceed the selectable value when it is implemented.

16 Claims, 2 Drawing Sheets

METHOD FOR THE OPERATION OF A MAGNETIC RESONANCE TOMOGRAPHY APPARATUS, MAGNETIC RESONANCE TOMOGRAPHY APPARATUS FOR THE IMPLEMENTATION OF THE METHOD AND METHOD FOR DESIGNING A MAGNETIC RESONANCE TOMOGRAPHY APPARATUS

BACKGROUND OF THE INVENTION

1. Field of the Invention

The present invention is directed to a method for the operation of a magnetic resonance tomography apparatus of the type having a basic field magnet, a gradient system with gradient coils and a control system that, among other things, controls the currents in the gradient coils to produce pulse sequences, as well as directed to an apparatus for the implementation of the method and to a method for designing a magnetic resonance tomography apparatus.

2. Description of the Prior Art

Magnetic resonance tomography is a known modality for acquiring images of the inside of the body of a living patient. The basic components of a magnetic resonance tomography apparatus are a basic field magnet, a gradient system and a control system that, to produce pulse sequences on the basis of pulse sequences, controls the currents in the gradient coils to produce pulse sequences. The time-variable coil currents achieve amplitude values of up to several 100 A and are subject to frequent and rapid changes in the direction of the current with rise and decay rates of several 100 kA/s. Given the presence of a basic magnetic field, these currents in the gradient coils cause vibrations due to Lorentz forces, which cause noise by vibrating components of the apparatus.

The focus of previous investigations for reducing noise has been to modify the transmission path, i.e. to a modify the mechanical structure of the magnetic resonance tomography apparatus. These modifications were roughly implemented on the basis of empirical values. Further, noise that differs in degree is only heard by an operator as a patient as a result of various pulse sequences after the implementation of the pulse sequences, as a subjective impression. Developments in the field of magnetic resonance tomography for shortening the measuring time and improving the image quality involve a boost of the currents in the gradient coils. The noise thus also increases.

In the article by R. A. Hedeen et al., "Characterization and Prediction of Gradient Acoustic Noise in MR Imagers", Magnetic Resonance in Medicine 37 (1997), pages 7–10, a noise that a pulse sequence causes when executed is calculated in advance before the execution of the pulse sequence, a transfer function is empirically derived from gradient pulses as an input quantity and noise as an output quantity. This transfer function is multiplied by the spectrum of the gradient pulses to be implemented. A noise spectrum identified in this way is substantially similar to the spectrum of the gradient pulses and is only slightly influences by acoustic resonances of the apparatus. Measures for direct reduction of the noise are not described in this article.

SUMMARY OF THE INVENTION

An object of the present invention is to provide a method or and an apparatus for the implementation of the method for obtaining information about the noise stress on a patient as well as for reducing noise, and to provide a method for the design of a gradient system that enables an optimization of the overall noise transmission path.

This object is achieved in a method wherein noise that a pulse sequence causes when implemented is determined before the start of the pulse sequence, and wherein, in the case of identified noise above a selectable value, the pulse sequence is modified, so that the modified pulse sequence does not exceed the selectable value when implemented.

The apparatus for the implementation of the method has a unit that determines noise that a pulse sequence causes when implemented, before a start of the pulse sequence, and a display that displays the identified noise, and where a control unit, given a modification of the displayed noise, modifies the noise-relevant parameters of the pulse sequence such that the modified display value of the noise is not exceeded upon implementation of the pulse sequence with the modified parameters. Alternatively the apparatus determines noise that a pulse sequence causes upon implementation thereof before a start of the pulse sequence, and checks the identified noise of the pulse sequence to determine whether a pre-select able value is exceeded, and determines a modification of the pulse sequence when this value is exceeded so that the modified pulse sequence does not exceed the pre-select able value when implemented, which causes and the modified pulse sequence to be implemented.

The object of providing a method for designing a gradient system is inventively achieved by deriving a transfer function from a gradient coil current as an input quantity and noise as output quantity, this transfer function being calculated dependent on a geometry, on material parameters and on a mechanical implementation of the apparatus.

The inventive method and apparatus have the advantage that instead of the noise for different pulse sequences being present only after the implementation of a pulse sequence and as a subjective impression or as a result of a measurement, the noise is calculated before the implementation of a pulse sequence and, following thereupon, a noise reduction becomes possible by simple modification of parameters of the pulse sequence.

In an embodiment, a repetition time of the pulse sequence is modified, when a modification of the pulse sequence is needed. A modification of the repetition time is a simple modification of a pulse sequence. The modification needed for noise reduction is simple to calculate given unaltered demands on the image quality.

In an another embodiment, the repetition time is modified so as to avoid a coincidence of whole-number multiples of a reciprocal of the repetition time with acoustic resonant frequencies of the apparatus.

In another embodiment in the pulse sequence modification, a forbidden frequency band of, preferably, ±20 Hz of the resonant frequency is defined around at least one of the resonant frequencies and any modification which would result in a frequency in this forbidden band is precluded.

In a further embodiment, the determination of the noise is implemented in the frequency domain, by deriving a system-inherent transfer function that from a gradient coil current as an input quantity and the noise as an output quantity, and this transfer function is multiplied, for each gradient coil, by the Fourier transform of the coil current for that gradient coil, the multiplication results are integrated over the frequency, and the integration results along the individual gradient axes are summed. Only transformation in the frequency domain enables a separation of the parameters and an exact calculation of the influences on the noise that are caused even by minute modifications of the parameters.

In another embodiment, the A acoustic pressure level of a pulse sequence is determined for this purpose by an A-weighted integration of the multiplication results. A weighting quantity is thus available for the noise of a pulse sequence that takes the properties of human hearing into consideration.

In another embodiment, one of the transfer functions is determined by excitation of the corresponding gradient coil with a current whose spectrum contains all noise relevant frequencies. All relevant frequency components of the transfer function thus are measured simultaneously with a single excitation. This results in the shortest measuring times in the experimental determination of the transfer functions.

In another embodiment, one of the transfer functions is determined by excitation of the corresponding gradient coil with a frequency sweep of sinusoidal currents. As a result, a discrete frequency point of the transfer function is determined with a defined amplitude with each sine oscillation.

In another embodiment, the Fourier analysis of the gradient coil current is implemented with a reciprocal of the repetition time of the pulse sequence as the fundamental frequency of the Fourier analysis. The Fourier analysis thus exclusively yields Fourier coefficients for whole-numbered multiples of the reciprocal of the repetition time.

In a further embodiment, the identified noise is displayed. An operator, for example, thus can evaluate whether a patient can reasonably withstand a noise stress dependent on condition and age, and can take this in the operator's other operating actions.

In another embodiment, an automatic modification of the pulse sequence to lower noise values is implemented when the identified noise exceeds a pre-selectable value. As a result, the operator is relieved of the need to make decisions on a case-by-case basis about the reasonableness of the noise, and that the modification of the pulse sequence toward lower noise values ensues automatically dependent on the pre-select able value without operator intervention.

DESCRIPTION OF THE PREFERRED EMBODIMENTS

Figure 1:
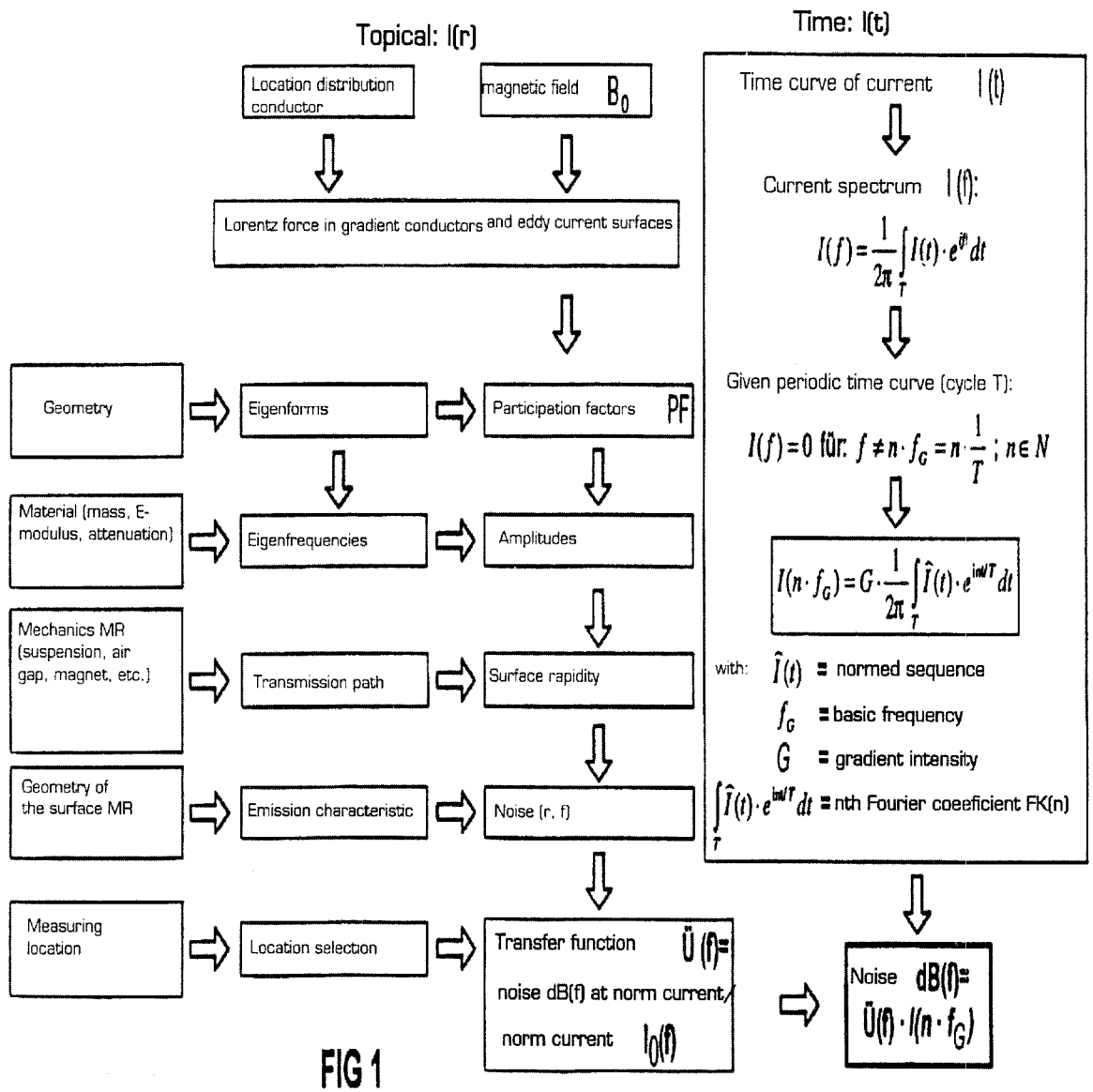
FIG. 1 is a flowchart of the inventive method for noise determination for a magnetic resonance tomography apparatus.

In the form of a flowchart, FIG. 1 shows the method of noise determination for magnetic resonance tomography apparatus underlying the invention, as an example. The gradient coil currents $l(r, t)$ have a location dependent on the basis of the different conductor arrangements for the respective gradient coils as well as a time dependency dependent on the controlling pulse sequence. Since the conductor arrangement of the coils is constant in time, a separation of $l(r, t)$ into a location-dependent component $l(r)$ and a time-dependent component $l(t)$ is possible.

Together with a number of parameters, the location-dependent component $l(r)$ determines a transfer function $\ddot{U}(f)$. The currents in the gradient coils experience Lorentz forces in the basic magnetic field that place the conductors of the gradient to vibrate. Further Lorentz forces act on conductive layers as a result of eddy current induction, these conductive layers being firmly connected to the gradient system, for example metallic devices for cooling the gradient coils or copper motherboards of a radio-frequency antenna system. The Lorentz forces are transmitted onto the entire gradient system and cause it to vibrate.

An analysis of these vibrations ensues based on the characteristic oscillations of the gradient system. The characteristic oscillatory behavior is defined by the eigenfrequencies and the natural-oscillation modes. The effect of the Lorentz forces on the natural-oscillation modes described in the form of participation (contribution) factors. These indicate how greatly the Lorentz forces excite a specific natural-oscillation mode. Mathematically, the scalar product between the Lorentz force at a point and the vector that describes the natural-oscillation movement at this location is formed for this purpose. These scalar products are determined for each point of the gradient system and are summed. A participation factor PF of a natural-oscillation mode results therefrom. The eigenfrequencies are calculated using the material parameters. Given knowledge of the participation factors PF and of the eigenfrequencies, the oscillation of the gradient system is determined for each location and for each frequency by superimposition of the oscillations of the individual natural-oscillation modes.

The vibrations are transmitted to the surfaces of the apparatus via various propagation paths. These are acquired frequency-resolved dependent on their significance. The speed of sound at the transition surfaces determines the transmission of mechanical vibration into acoustic oscillations and is calculated from the superimposition of the oscillations of the individual transmission paths. Together with the geometry of the surface, this determines the noise (r, f) of the apparatus.

The transfer function $\ddot{U}(f)$ arises from a defined excitation of a gradient coil with a norm current $l_o$ as an input quantity and the noise in dB produced as a result thereof at a specific location as an output quantity. One location is selected for forming the transfer function. Since the noise perceived by the patient is in the foreground, a location at which the head of the patient is normally located during the examination is advantageously selected. For example, the isocenter of the basic field magnet is prescribed by the NEMA regulation. The method explained above, however, can be applied for any arbitrary location.

A magnetic resonance tomography apparatus has a number of gradient coils that are operated with different currents. For determining the transfer functions, one gradient coil after the other is considered independently of the other. A transfer function is allocated to each gradient coil.

The computational determination of the transfer functions ensues according to the method described above using a finite element method calculation.

The experimental determination of the transfer functions ensues on the basis of an excitation of a gradient coil with a normalized current $l_o$ and with a frequency-resolved acoustic measurement of the noise in dB at a selected measuring location. Advantageous excitations are a frequency sweep of sine oscillations and white noise that has been low-pass filtered. In the frequency sweeps, the gradient coil is excited with a sinusoidal current of this frequency for each frequency at which the transfer function is to be measured. The scaling of the transfer function is thereby simple because the amplitude of the sine oscillation is directly read in amperes, or the gradient strength resulting therefrom is directly read in millitesla per meter.

Advantageously, the amplitude remains the same for all frequencies of the sweep. The second excitation for the experimental determination of the transfer function is based on the low-pass-filtered white noise. In the range from approximately 0 Hz through approximately 20000 Hz, which is based on the frequency range audible to a human, the transfer function of the low-pass filter is thereby equal to one and is equal to zero for higher frequencies. This low-pass-filtered white noise, a as quantity in the frequency domain, is transformed in to the time domain and is supplied as a normalized current to a gradient coil. It is taken into consideration in the frequency-resolved noise measurement that the gradient intensity of the low-pass-filtered, white noise is divided among all frequency components. The transfer function is simple to scale by comparing it to a corresponding sine measurement for a specific frequency. The measured transfer functions are very stable and do not fluctuate more then 1 dB between various measurements.

The transfer function of a typical magnetic resonance tomography apparatus increases with the frequency until a maximum is reached at a few kHz. At higher frequencies, a slight but continuous drop of the noise occurs, however, the spectrum of the transfer function is marked by clear, sharp resonances up to the maximum.

The time-dependent component l(t) is defined by the pulse sequence. The time curve l(t) of a coil current is converted into a frequency-dependent quantity l(f) by the Fourier transformation. Given a periodic time curve of l(t) with the cycle T, l(f) is simplified because l(f) assumes values different from 0 only given whole multiples of a fundamental frequency $f_G$ that is the reciprocal of the cycle T. The aforementioned values differing from 0 are divided by the gradient intensity G and are referred to as the $n^{th}$ Fourier coefficient FK(n). The running variable n thereby assumes only whole-numbered, positive values different from zero. The function l(f) is thereby converted into a function $l(n \cdot f_G)$. A normalized current curve l(t) arises from the current curve l(t) by division by the gradient intensity G. The cycle T is equal to the repetition time for a pulse sequence.

Characteristic quantities for pulse sequences that control the gradient coil currents are the gradient intensity, the repetition time, the rise and decay rates, the shape as well as the appertaining current integral of the pulse sequence, these quantities being partially linked to one another. An increase in the noise independently of the transfer function $\ddot{U}(f)$ occurs given an increase in the gradient intensity, given an increase of the current integral and given an increase of Fourier coefficients. The size of the Fourier coefficients is thereby determined by the shape of the pulse sequence. The noise in Pascals is directly proportional to the gradient intensity. For pulse sequences having many Fourier coefficients that determine the noise i.e., for pulse sequences having long repetition times-, a rough estimate of the noise is achieved by forming an average of the magnitudes of the Fourier coefficients. Measurements have shown that the aforementioned average value is directly proportional to the integral of the magnitude of the gradient coil current that flows during a cycle. The other characteristic quantities of a pulse sequence—repetition time as well as rise and decay rates—act on the noise dependent on the transfer function $\ddot{U}(f)$.

It is taken into consideration in the Fourier transformation of the gradient coil currents that the time signal of the pulse sequence employed is adequately long. This can be achieved by periodic sequencing of the pulse sequence. A repetition rate of 300 leads to an adequate signal length even given very fast pulse sequences. Given long pulse sequences, a reduced repetition rate should be selected in order to accelerate the calculation.

The multiplication of the transfer function $\ddot{U}(f)$ by the Fourier transform $l(n \cdot f_G)$ of the current curve in the gradient coil yields a frequency-resolved noise spectrum dB(f) that is characteristic of the respective pulse sequence. The acoustic pressure level is determined by a simple integral formation. The A-acoustic pressure level that takes the properties of human hearing into consideration is obtained given an A-weighted integral formation.

Magnetic resonance tomography devices have a number of gradient coils that are operated with different currents. This means for the method described above that the appertaining transfer functions are identified for all gradient coils, these are multiplied by the Fourier transform of the appertaining coil currents, and are summed after the integral formation.

Modifications of the frequency response of coils and amplifiers of the gradient system can occur under certain circumstances. Because a transfer function $\ddot{U}(f)$ does not describe the aforementioned modifications, the introduction of an auxiliary spectrum is advantageous, this being co-involved in the multiplication.

The same frequency range is selected for both spectra for the multiplication of the transfer function $\ddot{U}(f)$ by the Fourier transform $l(n \cdot f_G)$. A frequency range up to approximately 22 kHz is taken into consideration. A frequency resolution is employed at which no disturbing frequency shifts due to discretization occur that resolves the resonances well and is identical for both spectra. An advantageous resolution lies in the range of 1 Hz.

Given a modification of the repetition time, the Fourier coefficients remain of the same size but refer to a different fundamental frequency and thus form products with different values of the transfer function in the multiplication. The Fourier coefficients of the lower order usually have higher values, so that a shift of the high Fourier coefficients to higher values in the transfer function ensues given a shortening of the repetition time. This probably results in the greatest amount of noise. A massive reduction in noise on the basis of a shortening of the repetition time is possible when the coincidence of resonance frequencies of the transfer function with whole multiples of the reciprocal of the repetition time is avoided.

Further important quantities of a pulse sequence in view of the noise in addition to the gradient intensity are the Fourier coefficients of a lower order in combination with the repetition time. The rise and decay rates do not directly influence the noise. A variation of these rates can influence the repetition time and the Fourier coefficients, and thus influences the noise via these routes.

The method described above is employed for the determination of acoustic pressure levels for pulse sequences and for the determination of noise-optimized pulse sequences. A calculation of temporal noise spikes is possible when taking complex transfer functions into consideration.

A simplified method for avoiding noise is the definition of forbidden frequency bands around the resonant frequencies of the transfer functions, for example in a region of ±20 Hz. When Fourier coefficients greater than a defined threshold in these frequency bands, then this is displayed, an automatic modification of the repetition time is implemented or a recommendation (Prompt) to implement this modification is displayed.

Figure 2:
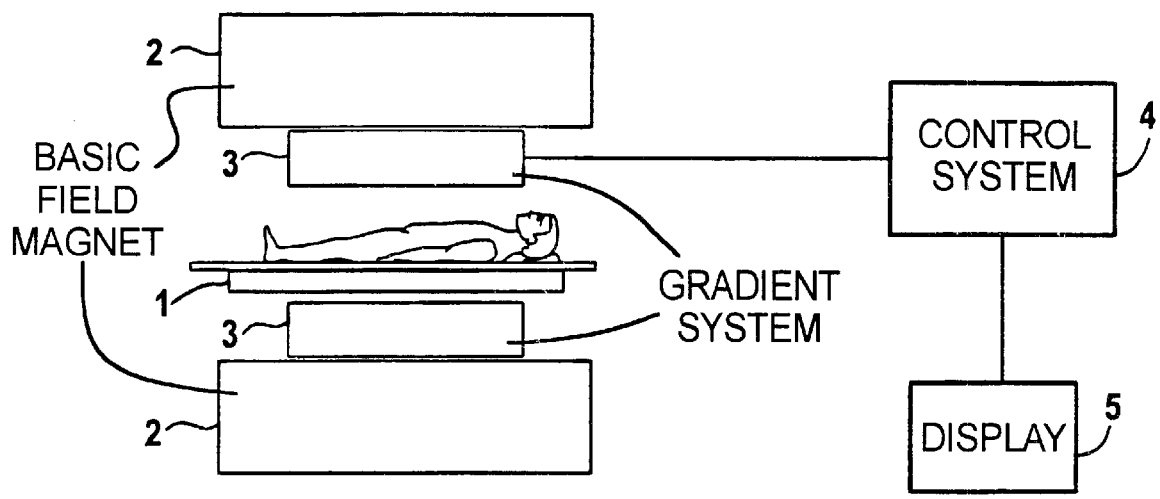
FIG. 2 is a schematic illustration of a magnetic resonance tomography apparatus constructed and operating in accordance with the invention.

As an example, FIG. 2 shows an overview of a magnetic resonance tomography apparatus, with only the components important to the invention being shown. A patient support 1, a basic field magnet 2, a gradient system 3, a control system 4 and a display 5 are identified as these basic components. The control system 4 contains the programs for pulse sequence control for the gradient system 3 and supplies data to the display 5. Further, the control system 4 contains an apparatus that determines the noise that a pulse sequence causes upon implementation, before the start of the pulse sequence, and supplies the determined noise to the display 5 for presentation.

In an embodiment, this device recognizes that noise identified for a pulse sequence exceeds a specific limit value stored in the device, an forwards an indication of this upward transgression to the display 5, determines a modified pulse sequence which, when implemented, does not cause the limit value to be exceeded, and supplies the modified pulse sequence or the identified change to the control system 4 for implementation thereof. The modification of the repetition time is thereby a simple modification of the pulse sequence. An adequately long lengthening of the repetition time leads to noise reduction but also leads to an undesired lengthening of the measuring time. A noise reduction is likewise achieved with a shortening of the repetition time when, differing from the original setting, coincidence of resonant frequencies of the transfer functions with whole multiples of the reciprocal of the repetition time is avoided. The device therefore determines the most beneficial repetition time for which the noise remains below the limit value. This can be determined, for example, with an iterative method the need for an optimally unmodified imaging characteristic as a boundary condition and taking the technical performance limits of the apparatus into consideration.

Figure 3:
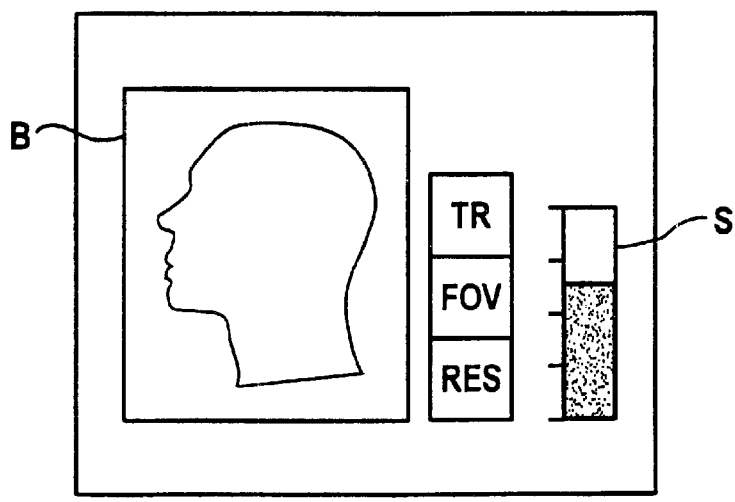
FIG. 3 shows an exemplary display on a display in accordance with the invention.

FIG. 3 shows the example of a display presentation on the display 5, for example a monitor. As generally standard, not only is a magnetic resonance image B displayed on the monitor, but also user information can be additionally mixed in. In addition to the standard information, an analog scale S is displayed on the monitor, the noise to be expected for a pre-set pulse sequence being displayed thereon. The type of a pulse sequence is usually pre-selected via a menu, whereby specific parameters of the pulse sequence can then also be selected by the user. Examples of such parameters of a pulse sequence are the slice orientation, the repetition time TR, the field of view FOV and the resolution RES. The slice orientation is generally graphically set, whereas standard defaults for the other aforementioned parameters are displayed numerically on the monitor. These standard defaults can, for example, be manually overwritten by keyboard input.

When the user has then selected a pulse sequence and the desired parameters have been set, information about the expected noise is also presented on the scale S before the start of the pulse sequence. When this seems too high to the operator, the operator has two possibilities. The operator can directly access the parameters and, for example, shorten the repetition time, select a smaller field of view, or reduce the resolution. Information as to the influence such modifications have on the noise is thereby obtained directly on the scale S. By drawing, for example, with a cursor on the scale S, the operator can also reduce the noise value that seems too high, and the control system 4 then accesses one or more parameters of the pulse sequence via a suitable algorithm and modifies these parameters such that the predetermined noise is not exceeded in the implementation of the modified pulse sequences. In both instances, the imaging properties are modified, however, the operator can thereby suitably consider between the noise stress on a patient, which is very differently sensed on an individual basis, and the imaging properties that are based on the diagnostic circumstances.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a magnetic resonance tomography apparatus having a basic field magnet which generates a basic magnetic field and a gradient system containing gradient coils operated by a control unit which supplies respective currents to said gradient coils to produce pulse sequences in which a current flows in at least one of said gradient coils, said current interacting with said basic magnetic field to produce Lorentz forces which cause noise in said apparatus, said method comprising the steps of:

determining a noise which a selected pulse sequence will cause when implemented before a start of said pulse sequence; and if said noise determined before said start of said pulse sequence exceeds a predetermined, selectable noise value, modifying said pulse sequence to produce a modified pulse sequence which causes noise that does not exceed said predetermined selectable noise value when implemented.

2. A method as claimed in claim 1 comprising modifying a repetition time of said pulse sequence to produce said modified pulse sequence.

3. A method as claimed in claim 2 wherein said apparatus has acoustic resonant frequencies, and comprising modifying said repetition time to avoid a coincidence of whole multiples of a reciprocal of said repetition time with said acoustic resonant frequencies of said apparatus.

4. A method as claimed in claim 3 comprising, for each acoustic resonant frequency of said acoustic resonant frequencies, defining a forbidden frequency band around the acoustic resonant frequency and avoiding coincidence of whole number multiples of said reciprocal of said repetition time with any frequency in any forbidden frequency band.

5. A method as claimed in claim 4 comprising, for each of said acoustic resonant frequencies, defining a forbidden frequency band of ±20 Hz around the acoustic resonant frequency.

6. A method as claimed in claim 1 comprising determining said noise in the frequency domain, for each of said gradient coils identifying a transfer function using the respective current therein as an input quantity and said noise as an output quantity, multiplying said transfer function for each of said gradient coils by the Fourier transform of the current therein to obtain a plurality of multiplication products, and integrating said multiplication products over the frequency domain to obtain a plurality of integration results, and summing said integration results as a determination of said noise.

7. A method as claimed in claim 6 comprising integrating said multiplication products by A-weighted integration to obtain an A-acoustic pressure level of said pulse sequence as said determination of said noise.

8. A method as claimed in claim 6 comprising determining said transfer for at least one of said gradient coils by exciting said at least one of said gradient coils with a gradient coil current having a spectrum containing all frequencies which are relevant for producing said noise.

9. A method as claimed in claim 6 comprising determining said transfer for at least one of said gradient coils by exciting said at least one of said gradient coils with a frequency band of sinusoidal currents.

10. A method as claimed in claim 6 comprising conducting a Fourier analysis of said respective current with a reciprocal of a repetition time of said pulse sequence as a basic frequency of said Fourier analysis.

11. A magnetic resonance tomography apparatus comprising:
   a basic field magnet which generates a basic magnetic field;
   a gradient system comprising gradient coils respectively supplied with current, at least one of said gradient coils with current flowing therein in said basic magnetic field producing Lorentz forces which cause noise in said apparatus;
   a control unit which controls supply of said currents to said gradient coils on the basis of pulse sequences;
   a noise-determining unit which determines a noise value that a selected pulse sequence will cause when implemented, before a start of said pulse sequence;
   a display on which the noise value determined by said noise-determining unit is displayed and which allows modification of the noise value to a modified noise value; and
   said noise-determining unit, upon modification of said noise value, modifying parameters of said pulse sequence so that said modified noise value is not exceeded when said pulse sequence is implemented with said modified parameters.

12. A magnetic resonance tomography apparatus as claimed in claim 11 wherein said display displays the noise value determined by said noise-determining unit together with a magnetic resonance image and said parameters of said pulse sequence.

13. A magnetic resonance tomography apparatus as claimed in claim 11 wherein said noise-determining device modifies a repetition time of said pulse sequence as the modified parameter.

14. A magnetic resonance tomography apparatus comprising:
   a basic field magnet which generates a basic magnetic field;
   a gradient system comprising gradient coils respectively supplied with currents, at least one of said gradient coils with current flowing therein in said basic magnetic field producing Lorentz forces which cause noise in said apparatus;
   a control unit which controls supply of said currents to said gradient coils on the basis of pulse sequences;
   a noise-determining unit which determines noise value that a selected pulse sequence will produce upon implementation thereof before a start of said selected pulse sequence, and which compares said noise value which said selected pulse sequence will produce to a predetermined noise value and, if said predetermined noise value is exceeded by said noise value, modifies said pulse sequence to generate a modified pulse sequence which produces a modified noise value does not exceed said predetermined noise value when said modified pulse sequence is implemented and which causes said control unit to implement said modified pulse sequence.

15. A magnetic resonance tomography apparatus as claimed in claim 14 wherein said noise-determining unit causes a modification of a repetition time of said selected pulse sequence to produce said modified pulse sequence.

16. A method for designing a magnetic resonance tomography apparatus comprising the steps of:
   for an initial version of a gradient system, composed of gradient coils, having a geometry, material parameters, and a mechanical structure, identifying a transfer function using a gradient coil current in said initial version of said gradient system as an input quantity and noise produced as a result of Lorentz forces caused by said gradient coil current flowing in said gradient system in a basic magnetic field, as an output quantity, dependent on said geometry, material parameters and said mechanical structure; and
   modifying at least one of said geometry, material parameters and mechanical structure of said initial gradient system, to obtain a final gradient system, to cause said noise to be below a predetermined noise level.

* * * * *